(12) United States Patent
Iwasaki (10) Patent No.: US 8,222,904 B2
(45) Date of Patent: Jul. 17, 2012

(54) BATTERY END-POINT VOLTAGE DETECTION METHOD AND BATTERY END-POINT VOLTAGE DETECTION SYSTEM

(75) Inventor: Mitsuharu Iwasaki, Yokohama (JP)

(73) Assignee: Texas Instruments Incorporated, Dallas, TX (US)

( * ) Notice: Subject to any disclaimer, the term of this patent is extended or adjusted under 35 U.S.C. 154(b) by 431 days.

(21) Appl. No.: 12/619,439

(22) Filed: Nov. 16, 2009

(65) Prior Publication Data

US 2010/0123463 A1 May 20, 2010

(30) Foreign Application Priority Data

Nov. 17, 2008 (JP) .................................. 2008-293854

(51) Int. Cl.
*G01N 27/416* (2006.01)
(52) U.S. Cl. .................. 324/433; 324/426; 320/136
(58) Field of Classification Search ............. 324/433
See application file for complete search history.

(56) References Cited

U.S. PATENT DOCUMENTS

| | | | | | |
|---|---|---|---|---|---|
| 3,797,894 | A | * | 3/1974 | Carp | 303/199 |
| 5,136,246 | A | * | 8/1992 | Sakamoto | 324/433 |
| 7,034,475 | B2 | * | 4/2006 | Kato et al. | 318/139 |
| 7,071,698 | B2 | * | 7/2006 | Furukawa et al. | 324/433 |
| 7,893,656 | B2 | * | 2/2011 | Sobue | 320/134 |
| 2008/0061745 | A1 | * | 3/2008 | Nodo | 320/162 |
| 2008/0169820 | A1 | * | 7/2008 | Nishimoto | 324/433 |
| 2009/0027011 | A1 | * | 1/2009 | Umetsu | 320/145 |
| 2009/0261838 | A1 | * | 10/2009 | Shull | 324/433 |

FOREIGN PATENT DOCUMENTS

JP 2000-338204 12/2000

* cited by examiner

*Primary Examiner* — Arun Williams
(74) *Attorney, Agent, or Firm* — William B. Kempler; Wade J. Brady, III; Frederick J. Telecky, Jr.

(57) ABSTRACT

Battery driven display device includes a battery, first and second comparators, non-volatile memory, controller driven by the voltage of the battery, and display device. Non-volatile memory stores the first and second reference voltages of the first and second comparators measured by using stabilized power supply. Controller detects when the first and second reference voltages of the first and second comparators become lower than the voltage of the battery when battery is connected, and determines the time at which end-point voltage of the battery will be reached based on the first and second detection times at the time of measurement and the measured reference voltages.

12 Claims, 7 Drawing Sheets

BATTERY END-POINT VOLTAGE DETECTION METHOD AND BATTERY END-POINT VOLTAGE DETECTION SYSTEM

CROSS-REFERENCE TO RELATED APPLICATIONS

This patent application claims priority from Japanese Patent Application No. 2008-293854, filed 17 Nov. 2008, which is incorporated herein by reference.

FIELD OF THE INVENTION

The present invention pertains to a battery end-point voltage detection method and detection system as well as to a battery-driven display device using said method and system.

BACKGROUND OF THE INVENTION

Electronic shelf labels, operating manuals, and other portable display devices have a battery in the internal power supply and use the power of the battery to drive electronic circuits or the like to display information. A certain driving voltage is required in order to operate the electronic circuits, etc. Therefore, when the output voltage of the battery drops below a certain level, a system that monitors the remaining capacity of the battery will stop use of the battery and urge the user to charge or replace the battery. For example, Japanese Kokai Patent Application No. 2000-338204 discloses a device that detects the current and voltage from a current sensor and a voltage sensor incorporated in a battery to measure the remaining capacity of the battery.

In a battery driven display device, in order to reduce the battery replacement frequency as much as possible, it is desired to use electronic circuits or displays with low power consumption. In particular, when the display content does not change frequently as in electronic shelf labels, it is appropriate to use electronic paper that only consumes power when the display content is electrically rewritten.

The remaining battery capacity measurement device disclosed in Japanese Kokai Patent Application No. 2000-338204 measures the remaining capacity in a battery for a hybrid car. It may not be suitable for portable battery driven display devices.

Figure 1:
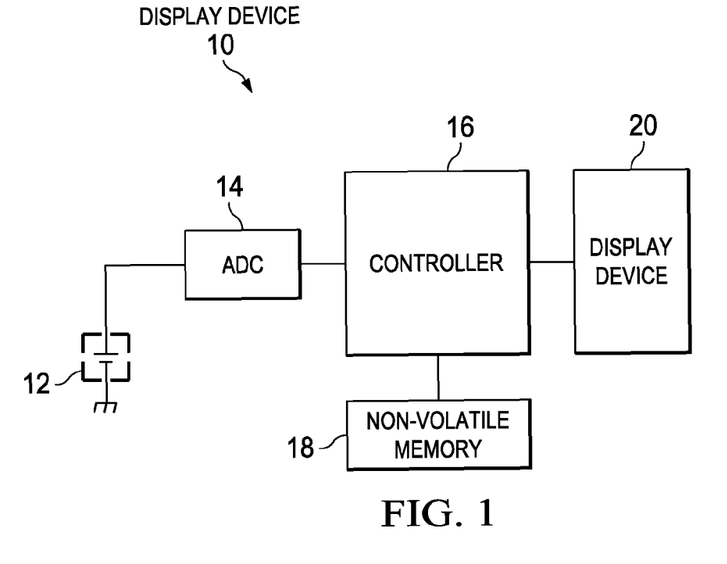
FIG. 1 is a block diagram illustrating the schematic configuration of a conventional portable display device.

FIG. 1 shows the configuration of a conventional battery driven display device. As shown in this figure, display device 10 is comprised of battery 12, such as a primary coin battery, A/D converter 14 that converts the analog voltage signal output from battery 12 into a digital voltage signal, controller 16, non-volatile memory 18 that stores display data and the like, and display device 20, such as electronic paper. Controller 16 reads out the display data stored in non-volatile memory 18 and displays them on display device 20. Also, controller 16 monitors the output of A/D converter 14 and measures the end-point voltage of battery 12. Since A/D converter 14 is used to measure the voltage of battery 12, it is possible to accurately calculate the end-point voltage by detecting the absolute voltage. The cost, however, is high.

Figure 2:
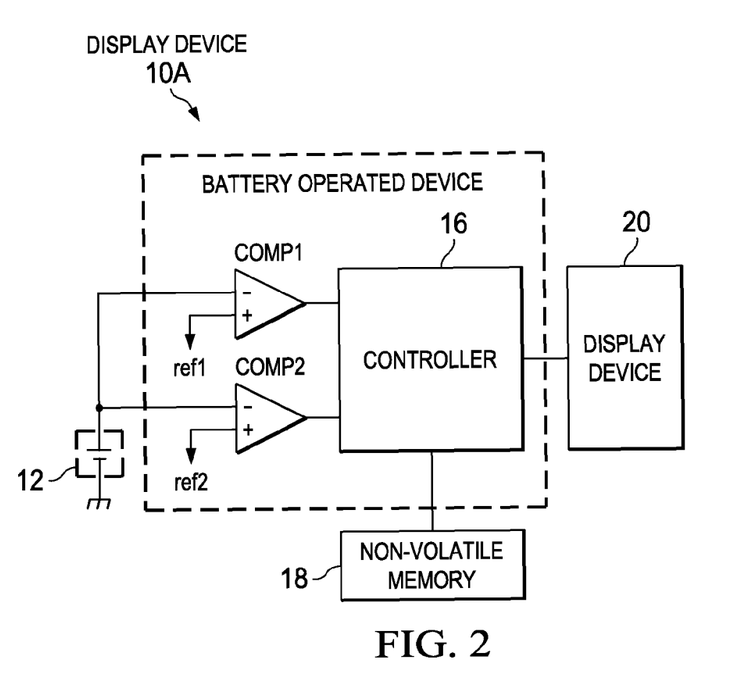
FIG. 2 is a block diagram illustrating the schematic configuration of another conventional portable display device.

FIG. 2 shows the configuration of another conventional battery driven display device. Display device 10A shown in this figure is equipped with two comparators COMP1, COMP2 instead of an A/D converter. Each of said comparators COMP1, COMP2 has one of the inputs connected to the output of battery 12 and the other input connected to a reference voltage ref1, ref2 (ref1<ref2), and said inputs are compared. If the input voltage is lower than the reference voltage, output signal switches from L (low) level to H (high) level.

Controller 16 calculates the time at which the end-point voltage of the battery will be reached or the time remaining from detection time T1 when the output of comparator COMP1 switches from L to H and detection time T2 when the output of comparator COMP2 switches from L to H. Controller 16 stops the use of the battery and recommends battery replacement on display device 20 when there is no remaining time, or when the end-point time has passed.

Figure 3:
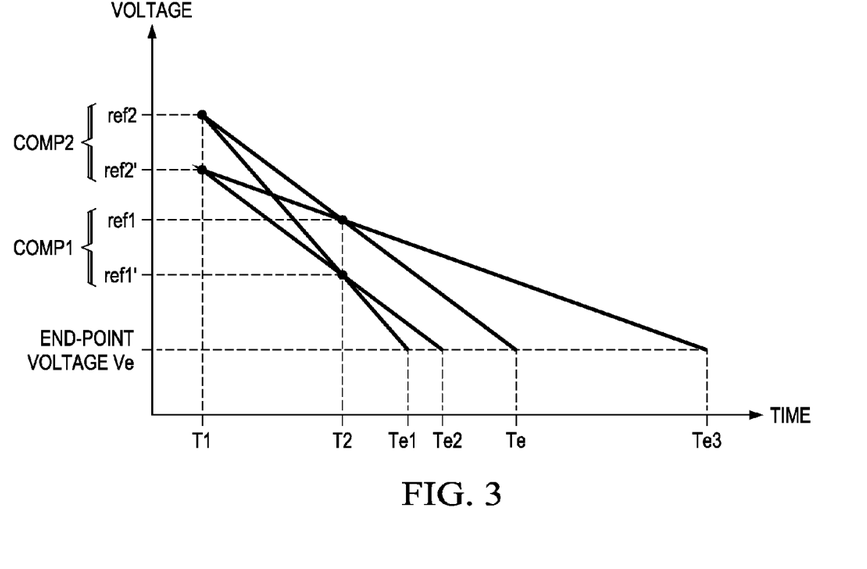
FIG. 3 is a diagram illustrating the method for calculating the time at which the end-point voltage of the battery will be reached in the portable display device shown in FIG. 2.

FIG. 3 is a diagram explaining the method for calculating the time remaining until reaching the end-point voltage by means of linear interpolation. The ordinate is voltage, while the abscissa is time. The detection time when comparator COMP2 switches from L to H is T1, the reference voltage of comparator COMP2 is ref2, the detection time when comparator COMP1 switches from L to H is T2, the reference voltage of comparator COMP1 is ref1, and the target end-point voltage is Ve. In this case, time Te for end-point voltage Ve can be derived from the point where a straight line passing references voltages ref2 and ref1 intersects end-point voltage Ve. The time remaining until reaching end-point voltage becomes Te−T2.

However, if reference voltages ref1, ref2 of comparators COMP1, COMP2 are not accurate, it is not possible to calculate the time Te until reaching the battery end-point voltage correctly. Reference voltages ref1, ref2 can be guaranteed in a range of about ±100 mV. In that case, however, as shown in FIG. 3, the detection range of comparator COMP2 becomes the range of ref2 and ref2', and the detection range of comparator COMP1 becomes the range of ref1 and ref1'. If the detection range of the comparator has a width, the time Te for end-point voltage Ve becomes Te1, Te2, Te3, and remaining time Te cannot be measured correctly. If the measurement error is large, the user may be urged to replace the battery even when the remaining capacity of the battery is sufficient. Alternatively, the battery becomes discharged and operation ends before it is replaced, making it impossible to use the battery effectively and properly.

SUMMARY OF THE INVENTION

An objective of the present invention is a solution of the aforementioned problem by providing a battery end-point voltage detection method and detection system, which can correctly detect the end of battery life for a battery driven display device.

A battery end-point voltage detection method disclosed in the present invention is for an electronic device including a battery, at least first and second comparators, a nonvolatile memory, and an electronic circuit driven by the voltage of the battery. Said method has the following steps: the voltage of an external power supply is supplied to the inputs of the first and second comparators; the voltage of the external power supply is used to measure the first and second reference voltages of the first and second comparators; the measured first and second reference voltages are stored in said non-volatile memory; the output voltage of the battery is supplied to the inputs of the first and second comparators; in the first comparator, a first detection time when the input voltage from the battery becomes lower than the first reference voltage is detected; in the second comparator, a second detection time when the input voltage from the battery becomes lower than the second reference voltage is detected; the time information regarding the end-point voltage of the battery is calculated based on the first and second detection times as well as the aforementioned measured first and second reference voltages.

In one aspect of the invention, the battery end-point voltage detection method also includes a step for outputting the time information regarding the end-point voltage of the battery. The time remaining until the battery end-point voltage is reached is calculated in said calculation step from the following equation.

$$T3 - T2 = \frac{Vref1 - Ve}{\left(\frac{Vref1 - Vref2}{T2 - T1}\right)}$$

Vref1: Measured first reference voltage
Vref2: Measured second reference voltage
Ve: End-point voltage
T1: First detection time
T2: Second detection time
T3: Time until the end-point voltage is reached A battery end-point voltage detection system disclosed in the present invention has a battery, at least first and second comparators, a non-volatile memory, a controller driven by the voltage of the battery, a connection means that connects an external power supply or battery to the inputs of the first and second comparators, and a reference voltage measurement means that uses the external power supply to measure the first and second reference voltages of the first and second comparators and stores the measured first and second reference voltages in said non-volatile memory when the external power supply is connected to the inputs of the first and second comparators by said connection means. Said controller has a detection means that detects a first detection time when the input voltage in the first comparator becomes lower than the first reference voltage and a second detection time when the input voltage in the second comparator becomes lower than the second reference voltage when the battery is connected to the first and second comparators by said connection means and a calculation means, that calculates the time information regarding the end-point voltage of the battery based on said measured first and second reference voltages and the first and second detection times.

In an aspect of the invention, said reference voltage measurement means makes the voltage output from the external power supply variable stepwise and uses the variable voltage at the time that the output of the first comparator is inverted as the measured first reference voltage and uses the variable voltage at the time that the output of the second comparator is inverted as the measured second voltage.

In an aspect of the invention, said battery, first and second comparators, said non-volatile memory, and said controller constitute a battery driven display device. Said reference voltage measurement means is installed in a test device used for testing said display device. The measurement of the first and second reference voltages is performed by said reference voltage measurement means in a test sequence before the display device is shipped.

A battery driven display device includes a battery, at least first and second comparators, a non-volatile memory, a display medium, and a controller that is driven by the voltage of the battery and can display the display data stored in said non-volatile memory on said display medium. Said non-volatile memory stores the first and second reference voltages of the first and second comparators measured by using an external power supply. Said controller detects a first detection time when the input voltage in the first comparator becomes lower than the first reference voltage and detects a second detection time when the input voltage in the second comparator becomes lower than the second reference voltage when the battery is connected to the inputs of the first and second comparators. Said controller calculates the time information regarding the end-point voltage of the battery based on said measured first and second reference voltages as well as the first and second detection times.

In an aspect of the invention, said controller also displays the calculated time information on said display medium. Preferably, the battery driven display device also includes a communication means capable of wireless data communication. Said controller stores display data obtained from said communication means in said non-volatile memory and sends the time information regarding the end-point voltage of said battery to an external device via said communication means. Said display medium may comprise electronic paper, and said display data may include price tag information.

REFERENCE NUMERALS AS SHOWN IN THE DRAWINGS

In the figures, 12 represents a battery, 16 represents a controller, 18 represents a non-volatile memory, 20 represents a display memory, 100 represents a battery driven display device, 200 represents a test device, 210 represents a stabilized power supply, 220 represents an A/D converter, 230 represents a controller, 300 represents a display device, 310 represents a server, 320 represents a data communication part.

DESCRIPTION OF THE EMBODIMENTS

According to an aspect of the present invention, since an external power supply is used to measure the first and second reference voltages of the first and second comparators, even if the width of the performance guarantee for the first and second reference voltages is wide and the first and second reference voltages have large variations, correct values for the first and second reference voltages can be obtained. The measured first and second reference voltages are then stored in a non-volatile memory. When the first and second comparators detect a drop in the voltage of the battery, the first and second reference voltages read from the non-volatile memory are used to calculate the time information regarding the end-point voltage. Therefore, the time remaining until reaching the end-point voltage can be calculated correctly. In this way, the battery can be used effectively, and the battery replacement warning can be performed at an appropriate time.

In the following, the battery driven display device disclosed in an embodiment of the present invention will be explained with reference to figures.

Figure 4:
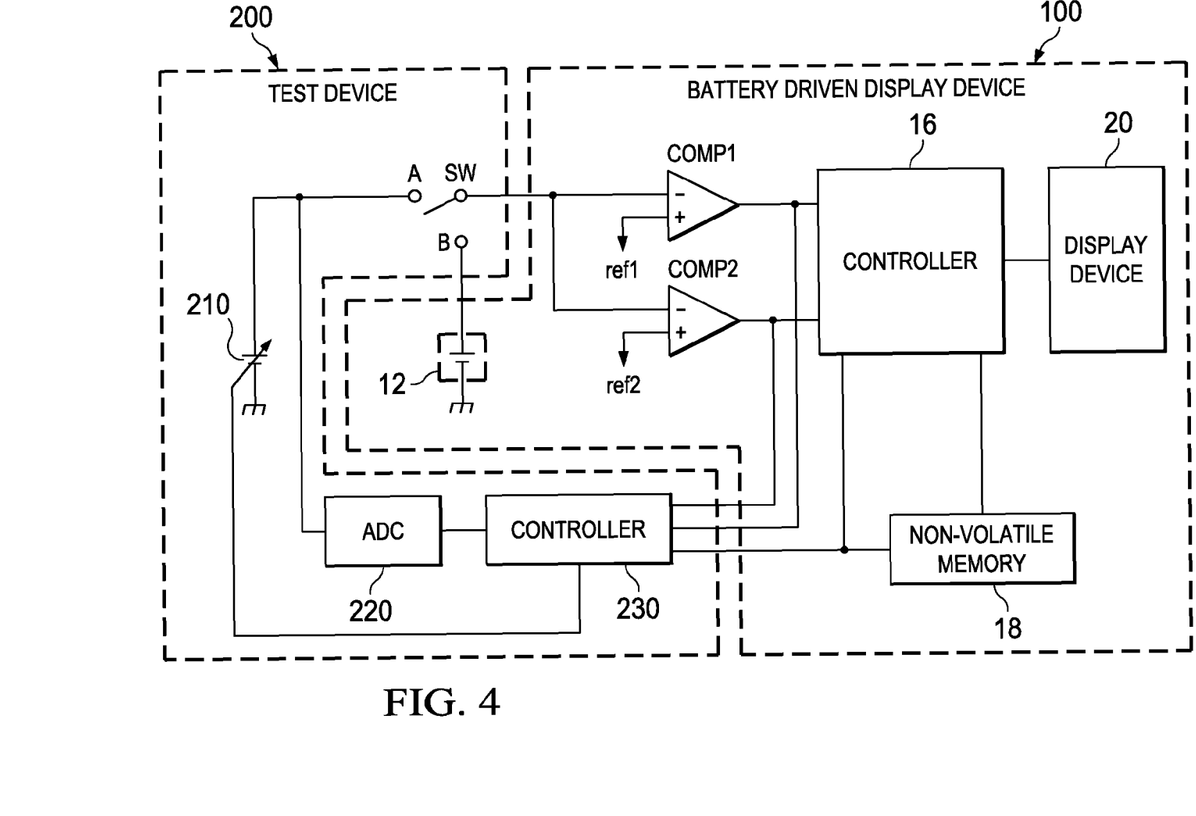
FIG. 4 is a block diagram illustrating the schematic configuration of the battery end-point voltage detection system disclosed in an embodiment of the present invention.

FIG. 4 is a block diagram illustrating battery driven display device 100 disclosed in an embodiment of the present invention and test device 200 connected to said display device.

Battery driven display device 100 has the same basic configuration as conventional display device 10A shown in FIG. 2. In other words, display device 100 includes battery 12, such as a primary battery, two comparators COMP1, COMP2, controller 16, non-volatile memory 18, and display device 20.

The output of switch SW is connected to the inverted input of comparator COMP1. Reference voltage ref1 is connected to the non-inverted input. When the input voltage is higher than reference voltage ref1, comparator COMP1 outputs an L-level signal. When the input voltage is lower than reference voltage ref1, the comparator outputs an H-level signal.

Similarly, the output of switch SW is connected to the inverted input of comparator COMP2, and reference voltage ref2 is connected to the non-inverted input. When the input voltage is higher than reference voltage ref2, comparator COMP2 outputs an L-level signal. When the input voltage is lower than reference voltage ref2, the comparator outputs an H-level signal. In this case there is a relationship in which reference voltage ref1<reference voltage ref2.

Controller 16 is, for example, constituted with a microcomputer including ROM, RAM, and a timer. The program used for displaying the display data on display device 20 and the program used for managing the remaining capacity of the battery are stored in ROM. Controller 16 reads the display data stored in non-volatile memory 18, displays said data on display device 20, monitors the outputs of comparators COMP1, COMP2, and calculates the time when the end-point voltage of the battery will be reached by means of said program.

Non-volatile memory 18 is, for example, constituted with EEPROM or flash memory. In this embodiment, non-volatile memory 18 stores not only the display data to be displayed on display device 20 but also the reference voltages of comparators COMP1, COMP2 measured in a test sequence before shipping display device 100, as will be described later.

Although there is no special limitation on display device 20, it is preferably constituted with electronic paper that consumes little power. It is known that there are microcapsule type electronic paper and electronic powder electronic paper. Power is consumed only when the display content is rewritten electrically. No power is consumed during display. However, display device 20 is not limited to electronic paper. It is also possible to constitute it with liquid crystal elements or the like.

Test device 200 tests whether each part of display device 100 operates properly before display device 100 is shipped. Test device 200 is comprised of switch SW, stabilized power supply 210, analog/digital converter (ADC) 220, and microcontroller 230. Preferably, microcontroller 230 stores the test program used for testing display device 100 in its ROM.

In this embodiment, the test program of test device 200 includes a measurement sequence that correctly measures the reference voltages ref1, ref2 of comparators COMP1, COMP2 of display device 100 and stores the measured reference voltages in non-volatile memory 18. In the measurement sequence, microcontroller 230 operates switch SW to vary the voltage output from stabilized power supply 210 stepwise and supply the variable voltage from stabilized power supply 210 to the inverted inputs of comparators COMP1, COMP2. In addition, when it is detected that the inverted inputs of comparators COMP1, COMP2 are higher than reference voltages ref1, ref2 (that is, when the outputs switch from H level to L level), microcontroller 230 receives the digital voltage signal obtained by converting the analog voltage signal of stabilized power supply 210 from A/D converter 220 and writes said voltage value into non-volatile memory 18 as measured reference voltages ref1, ref2 of the comparators.

The operation of the end-point voltage detection system with the aforementioned configuration will be explained in the following.

(Measurement of the Reference Voltages of the Comparators)

Figure 5:
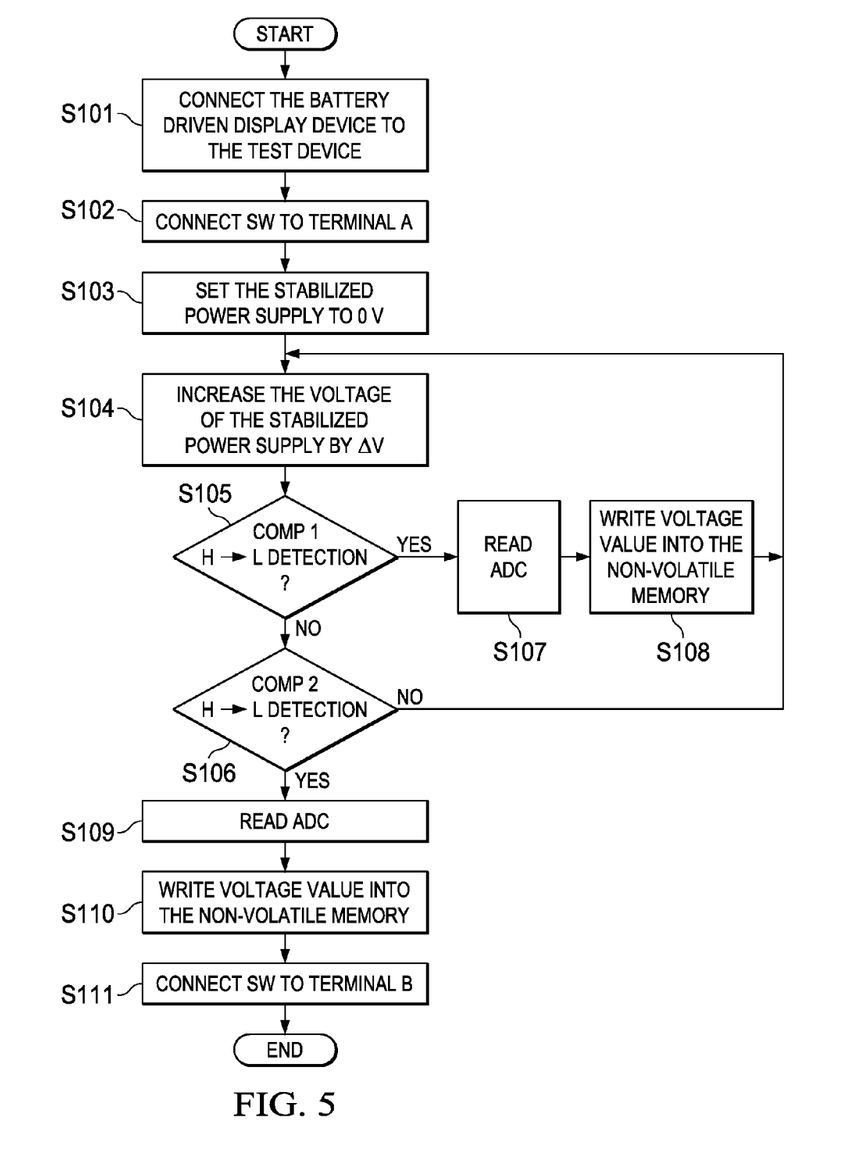
FIG. 5 is an operation flow chart illustrating the method of measuring the reference voltages of the comparator by using the test device disclosed in this embodiment.

FIG. 5 is a flow chart illustrating the reference voltage measurement operation performed by the test device. Before display device 100 is shipped, display device 100 is connected to test device 200 (step S101). A test is conducted by test device 200 to check whether display device 100 operates properly. When the measurement sequence in the test program is started, controller 230 connects the output of switch SW to input terminal A (step S102). In this way, the voltage of stabilized power supply 210 is supplied to the inverted inputs of comparators COMP1, COMP2.

Then, controller 230 sets stabilized power supply 210 to 0 V (step S103) and performs control such that the output voltage of stabilized power supply 210 is increased by ΔV from said set level (step S104). The measurement accuracy of reference voltages ref1, ref2 can be improved as ΔV is reduced. When the guaranteed voltage width (variation width) of reference voltages ref1, ref2 of comparators COMP1, COMP2 is ±ΔM, for example, ΔV is set to ΔM/10.

The voltage varied by ΔV is supplied to the inverted inputs of comparators COMP1, COMP2. When the varied voltage is lower than reference voltages ref1, ref2, the outputs of comparators COMP1, COMP2 are at H level. Controller 230 checks whether the outputs of comparators COMP1, COMP2 switch from H level to L level (steps S105, S106). If inversion of the output from H to L is not detected, the process returns to step S104. Controller 230 increases the voltage of stabilized power supply 210 by another ΔV and supplies it to comparators COMP1, COMP2. The controller repeats said process.

Since reference voltage ref1 is lower than reference voltage ref2, the output of comparator COMP1 inverts from H to L ahead of comparator COMP2 (step S105). When inversion of the output from H to L is detected, controller 230 reads the digital voltage signal obtained from conversion of the analog voltage signal of stabilized power supply 210 by A/D converter 220 (step S107). The read digital voltage signal is written as measured reference voltage Vref1 (the measured reference voltage is expressed as Vref1, to be distinguished from reference voltage ref1) into non-volatile memory 18 (step S108).

Then, when inversion of the output of comparator COMP2 from H to L is detected (step S106), controller 230 reads the output of A/D converter 220 at that time (step S109) and writes the read voltage signal into non-volatile memory (step S110) as measured reference voltage Vref2 (the measured reference voltage is expressed as Vref2, to be distinguished from reference voltage ref2). Controller 230 switches the output of switch SW to input terminal B when measurement of the reference voltages is completed or when all of the test sequences are completed (step S111).

(Battery Monitoring Operation)

Figure 6:
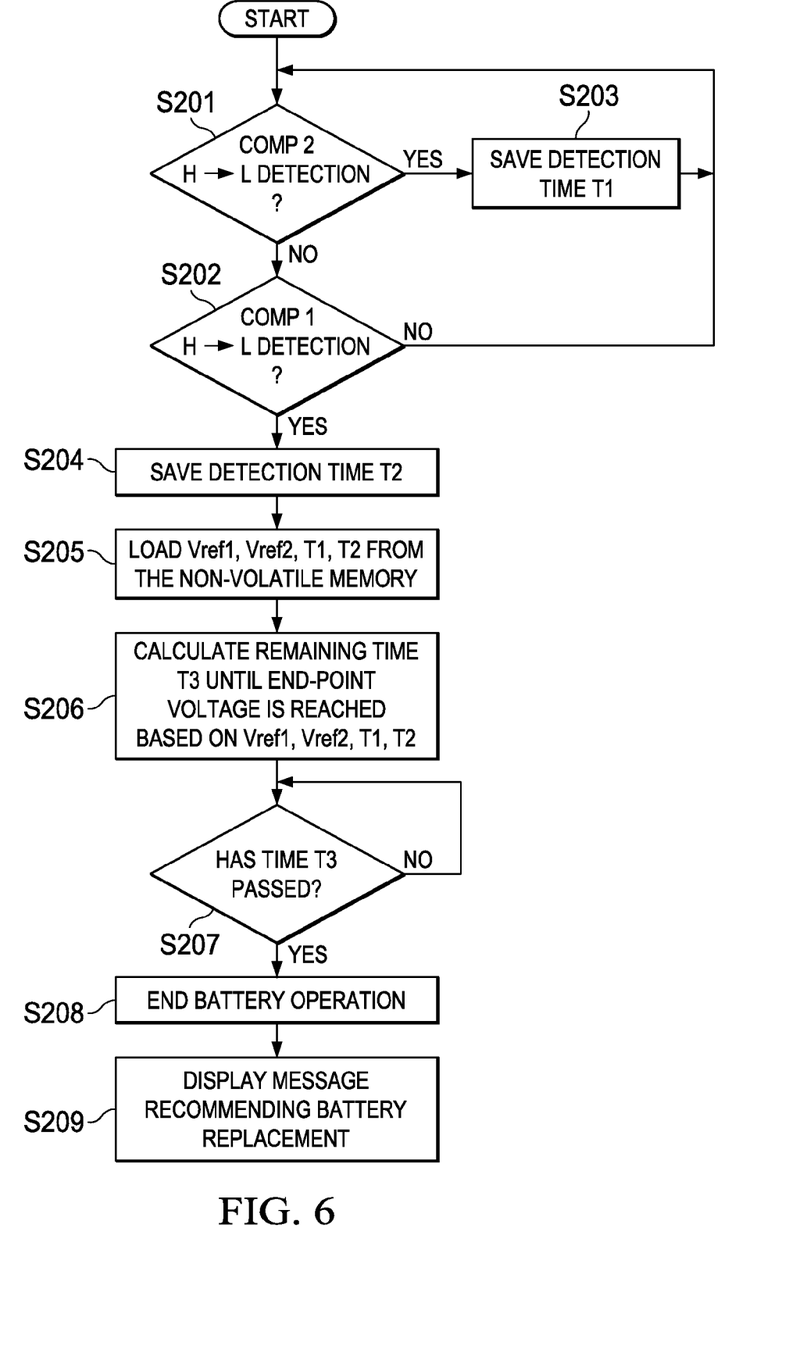
FIG. 6 is a flow chart illustrating the operation for monitoring the battery in the display device of the present invention.

FIG. 6 is a flow chart illustrating operation when monitoring the battery in the display device of this embodiment. The output voltage of battery 12 is supplied to the inverted inputs of comparators COMP1, COMP2. Also, controller 16 enters a state drivable by the voltage supplied from battery 12, starts time measurement by the internal timer, reads out the display data from non-volatile memory 18 if necessary, and displays the display data on display device 20.

Controller 16 monitors the outputs of comparators COMP1, COMP2 and detects whether said outputs have changed from L level to H level (steps S201, S202). Since the output voltage of battery 12 is higher than reference voltages ref1, ref2, the outputs of comparators COMP1, COMP2 are at L level.

Since reference voltage ref2 is higher than ref1, when the output voltage of the battery drops, the output of comparator COMP2 inverts from L level to H level ahead of comparator COMP1 (step S201). When inversion of the output of comparator COMP2 is detected, controller 16 stores the value counted by the internal timer at that time as detection time T1 in non-volatile memory 18 (step S203). Detection time T1 is the time when the output of switch SW is connected to input terminal B, that is, when the timer has finished time measurement.

Also, when the output voltage of battery 12 drops, the inverted input becomes lower than reference voltage ref1, and the output of comparator COMP1 inverts from L level to H level (step S202). Controller 16 stores detection time T2 at that time in non-volatile memory 18 (step S204).

Controller 16 then reads measured reference voltages Vref1, Vref2 and detection times T1, T2 stored in non-volatile memory 18 and calculates the time when the end-point voltage of the battery will be reached or the remaining time based on measured reference voltages Vref1 and Vref2 and detection times T1, T2 (step S206).

Figure 7:
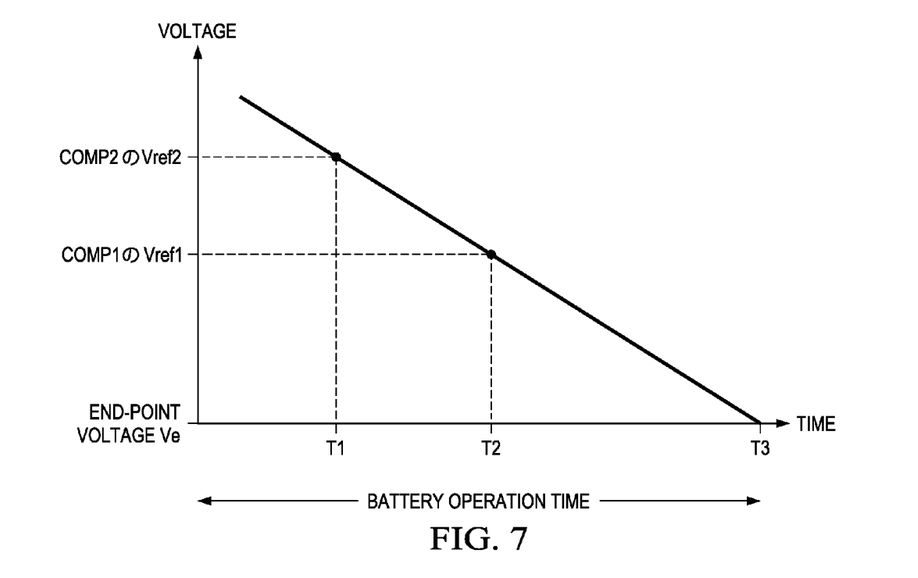
FIG. 7 is a diagram illustrating the method for calculating the time remaining until the battery end-point voltage is reached in this embodiment.

FIG. 7 is a diagram illustrating an example of calculating time T3 at which the end-point voltage will be reached. The ordinate is the voltage, while the abscissa is the time. In this example, time T3 at which the end-point voltage Ve will be reached is calculated using the following equation based on the relationship between measured reference voltage Vref2 of comparator COMP2 and its detection time T1 and the relationship between measured reference voltage Vref1 of comparator COMP1 and its detection time 2 [sic; T2].

$$T3 - T2 = \frac{Vref1 - Ve}{\left(\frac{Vref1 - Vref2}{T2 - T1}\right)} \quad \text{Equation 1}$$

Vref1: Measured first reference voltage
Vref2: Measured second reference voltage
Ve: End-point voltage
T1: First detection time
T2: Second detection time
T3: Time until the end-point voltage is reached
T3−T2 represents the time remaining from the current time until end-point voltage Ve is reached. Controller 16 stores the derived time T3 when the end-point voltage will be reached in non-volatile memory 18 and monitors whether the use time of the battery has exceeded time T3 at which the end-point voltage will be reached (step S207). The use time of the battery is measured by the internal timer of controller 16. Monitoring by controller 16 is not necessarily performed constantly. It is also possible to perform monitoring at specific time intervals.

When it is detected that time T3 at which the end-point voltage will be reached has been exceeded, controller 16 substantially ends battery operation (step S208) so that battery power will no longer be consumed. Then, a warning is displayed on display device 20 to remind the user to replace the battery (step 209).

According to this embodiment, even if there is variation in the guarantee ranges of reference voltages ref1, ref2 of comparators COMP1, COMP2, since an external power supply is used to accurately measure the reference voltage that is used in calculating the time at which the end-point voltage will be reached, time T3 for end-point voltage can be derived accurately. As a result, battery operation can be stopped at the proper time, and the user will be urged to replace the battery.

Figure 8:
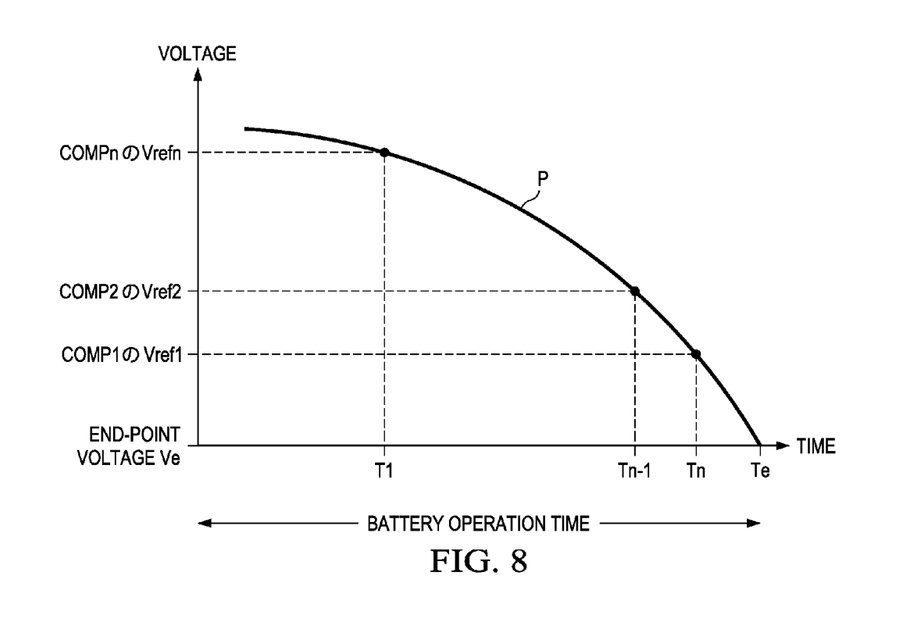
FIG. 8 is a diagram illustrating another method for calculating the time remaining until the battery end-point voltage is reached in this embodiment.

In the aforementioned embodiment, the time at which the end-point voltage will be reached is calculated by means of linear interpolation. If the variation in the output voltage with respect to the remaining capacity of the battery is a curve or non-straight line P, such as parabola, as shown in FIG. 8, it is also possible to use n (where n is an integer of 3 or larger) comparators to interpolate the curve or non-straight line P based on the relationship between the measured reference voltages (Vref1, Vref2, . . . Vrefn) and detection times (T1, T2, . . . Tn) in order to calculate time Te at which end-point voltage Ve will be reached.

Also, if the relationship of the variation (straight line or curve) in the output voltage with respect to the remaining capacity of the battery is known in advance, it is also possible to store said relationship in non-volatile memory 18 and calculate the time until the end-point voltage is reached from said relationship as well as from the reference voltage and detection time. For example, for the linear relationship shown in FIG. 7, when the slope is stored in non-volatile memory 18, it is possible to derive time T3 at which end-point voltage Ve will be reached at least from measured reference voltage Vref2 and detection time T1. Similarly, if curve P shown in FIG. 8 is known, it is possible to derive time Te at which end-point voltage Ve will be reached from at least one measured reference voltage and detection time.

Also, in the aforementioned embodiment, when the reference voltages of comparators COMP1, COMP2 are measured, the voltage of the stabilized power supply is increased from 0 V to ΔV. However, it is also possible to set the voltage of the stabilized power supply to the maximum allowable voltage and reduce the voltage from said maximum voltage by ΔV to measure the reference voltages.

Figure 9:
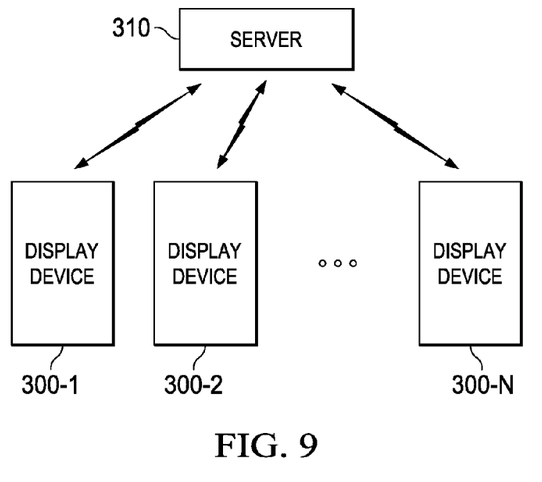
FIG. 9 is a diagram illustrating schematically an electronic price tag system using the display device disclosed in the second embodiment.
Figure 10:
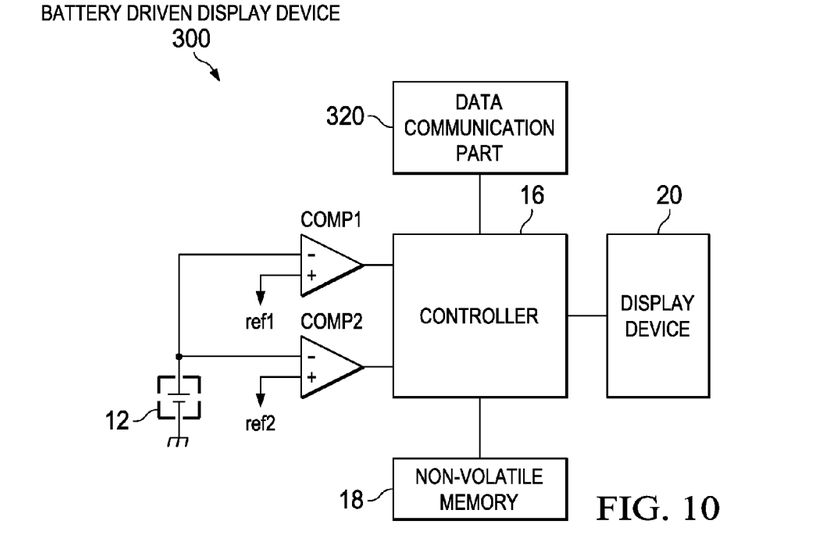
FIG. 10 is the schematic block diagram of the battery driven display device disclosed in the second embodiment.

The second embodiment of the present invention will be explained in the following. FIG. 9 shows schematically an electronic price tag system to which the battery driven display device disclosed in this embodiment is applied. FIG. 10 is a schematic block diagram of the battery driven display device used in the second embodiment. As shown in FIG. 9, battery driven display device 300 (300-1, 300-2, 300-N) is used as an electronic price tag that displays the prices of commodities in stores or shops. Server 310 monitors all the display devices 300, instructs display devices 300 to rewrite the price tags, and manages the replacement periods for the batteries.

As show in FIG. 10, display device 300 has, in addition to the configuration of the first embodiment, a data communication part 320 that communicates with server 310 by using IR. To change a price tag, server 310 identifies display device 300 concerned and sends said display device 300 a command to rewrite the price tag and the price tag information to be changed to. The data communication part 320 of display device 300 receives said command and price tag information. Controller 16 decodes the command and rewrites the price tag of display device 20. Also, the price tag information is stored in non-volatile memory 18. The communication method of data communication part 320 is not limited to IR communication. It is also possible to perform other types of wireless communication.

When it is found that the use time of the battery has exceeded the time remaining until reaching the end-point voltage, controller 16 displays a message on display device 20 recommending battery replacement and outputs the fact that the remaining time has elapsed to server 310 via data communication part 320. Upon receiving said information, server 310 sends an alarm to urge the user to replace the battery of display device 300. It is also possible for server 310 to access display device 300 at certain time intervals, and controller 16 outputs a message recommending battery replacement to server 310 in response to this access.

A preferred embodiment of the present invention has been described. The present invention is not limited to this specific embodiment. It is possible to make various modifications or changes within the scope of the present invention as described in the claims.

A primary battery is used as the battery in the aforementioned embodiment. However, it is also possible to use a rechargeable secondary battery. Electronic paper is used as the display device. However, it is also possible to use a liquid crystal, plasma or other display medium. The battery driven display device of the present invention is not limited to the configuration explained for said embodiment. It can include other configurations. Also, in the aforementioned embodiment, detection of the end-point voltage of the battery and calculation and other processing are carried out using software (programs) stored in the controller. However, they can also be carried out using a hardware processing circuit.

Although the present invention has been described in detail, it should be understood that various changes, substitutions and alterations can be made hereto without departing from the spirit and scope of the invention as defined by the appended claims.

The invention claimed is:

1. A battery end-point voltage detection method for an electronic device, including a battery, at least first and second comparators, a nonvolatile memory, and an electronic circuit driven by the voltage of the battery, comprising:
   supplying a voltage of an external power supply to the inputs of the first and second comparators;
   using the voltage of the external power supply to measure first and second reference voltages of the first and second comparators, respectively;
   storing the measured first and second reference voltages in said non-volatile memory;
   supplying an output voltage of the battery to inputs of the first and second comparators;
   detecting in the first comparator, a first detection time when the input voltage from the battery becomes lower than the first reference voltage;
   detecting in the second comparator, a second detection time when the input voltage from the battery becomes lower than the second reference voltage; and
   determining time information regarding the end-point voltage of the battery based on the first and second detection times as well as the measured first and second reference voltages.

2. The battery end-point voltage detection method described in claim 1, further comprising outputting the time information regarding the end-point voltage of the battery.

3. The battery end-point voltage detection method described in claim 1, wherein the time remaining until the battery end-point voltage is reached is determined from the equation:

$$T3 - T2 = \frac{Vref1 - Ve}{\left(\frac{Vref1 - Vref2}{T2 - T1}\right)}$$

Vref1: Measured first reference voltage
Vref2: Measured second reference voltage
Ve: End-point voltage
T1: First detection time
T2: Second detection time
T3: Time until the end-point voltage is reached.

4. A battery end-point voltage detection system having
   at least first and second comparators;
   a non-volatile memory;
   a controller to be driven by the voltage of a battery;
   a connection means that connects an external power supply or battery to the inputs of the first and second comparators; and
   a reference voltage measurement means that uses the external power supply to measure the first and second reference voltages of the first and second comparators and stores the measured first and second reference voltages in the non-volatile memory when the external power supply is connected to the inputs of the first and second comparators by the connection means, wherein said controller has:
   a detection means that detects a first detection time when the input voltage in the first comparator becomes lower than the first reference voltage and a second detection time when the input voltage in the second comparator becomes lower than the second reference voltage when the battery is connected to the first and second comparators by the connection means; and
   a determination means that determines the time information regarding the end-point voltage of the battery based on the measured first and second reference voltages and the first and second detection times.

5. The battery end-point voltage detection system described in claim 4, wherein the reference voltage measurement means makes the voltage output from the external power supply variable stepwise and uses the variable voltage at the time that the output of the first comparator is inverted as the measured first reference voltage and uses the variable voltage at the time that the output of the second comparator is inverted as the measured second voltage.

6. The battery end-point voltage detection system described in claim 4, wherein the first and second comparators, the non-volatile memory, and the controller constitute a driven display device to be battery operated;
   the reference voltage measurement means is installed in a test device used for testing the display device; and
   the measurement of the first and second reference voltages is performed by the reference voltage measurement means in a test sequence before the display device is shipped.

7. A battery driven display device including:
   a battery;
   at least first and second comparators;

a non-volatile memory; the non-volatile memory stores the first and second reference voltages of the first and second comparators measured by using an external power supply;

a display medium;

a controller that is driven by the voltage of the battery and can display data stored in the non-volatile memory on the display medium and detects a first detection time when the input voltage in the first comparator becomes lower than the first reference voltage and detects a second detection time when the input voltage in the second comparator becomes lower than the second reference voltage when the battery is connected to the inputs of the first and second comparators, and calculates the time information regarding the end-point voltage of the battery based on the measured first and second reference voltages as well as the first and second detection times.

8. The battery driven display device described in claim 7, wherein the controller also displays the calculated time information on said display medium.

9. The battery driven display device described in claim 7, wherein battery driven display device also includes a communication means capable of wireless data communication; the controller stores display data obtained from the communication means in the non-volatile memory and sends the time information regarding the end-point voltage of the battery to an external device via the communication means.

10. The battery driven display device described in claim 7, wherein the display medium comprises electronic paper, and the display data include price tag information.

11. The battery end-point voltage detection method described in claim 4, wherein the time remaining until the battery end-point voltage is reached is determined from the equation:

$$T3 - T2 = \frac{Vref1 - Ve}{\left(\frac{Vref1 - Vref2}{T2 - T1}\right)}$$

Vref1: Measured first reference voltage
Vref2: Measured second reference voltage
Ve: End-point voltage
T1: First detection time
T2: Second detection time
T3: Time until the end-point voltage is reached.

12. The battery end-point voltage detection method described in claim 7, wherein the time remaining until the battery end-point voltage is reached is determined from the equation:

$$T3 - T2 = \frac{Vref1 - Ve}{\left(\frac{Vref1 - Vref2}{T2 - T1}\right)}$$

Vref1: Measured first reference voltage
Vref2: Measured second reference voltage
Ve: End-point voltage
T1: First detection time
T2: Second detection time
T3: Time until the end-point voltage is reached.

* * * * *